United States Patent
Igarashi et al.

(10) Patent No.: US 12,453,011 B2
(45) Date of Patent: Oct. 21, 2025

(54) ELECTRONIC CONTROL DEVICE

(71) Applicant: Hitachi Astemo, Ltd., Hitachinaka (JP)

(72) Inventors: Takeshi Igarashi, Hitachinaka (JP); Katsuya Oyama, Hitachinaka (JP)

(73) Assignee: Hitachi Astemo, Ltd., Hitachinaka (JP)

( * ) Notice: Subject to any disclaimer, the term of this patent is extended or adjusted under 35 U.S.C. 154(b) by 92 days.

(21) Appl. No.: 18/029,945

(22) PCT Filed: Sep. 24, 2021

(86) PCT No.: PCT/JP2021/035111
§ 371 (c)(1),
(2) Date: Apr. 3, 2023

(87) PCT Pub. No.: WO2022/145094
PCT Pub. Date: Jul. 7, 2022

(65) Prior Publication Data
US 2023/0380068 A1    Nov. 23, 2023

(30) Foreign Application Priority Data
Dec. 28, 2020  (JP) ................................ 2020-218926

(51) Int. Cl.
*H05K 1/18* (2006.01)
*H01L 23/12* (2006.01)
(Continued)

(52) U.S. Cl.
CPC ............ *H05K 1/181* (2013.01); *H01L 23/12* (2013.01); *H01L 23/3107* (2013.01); *H05K 3/3431* (2013.01); *H05K 2201/09372* (2013.01)

(58) Field of Classification Search
CPC ..................................................... H05K 1/181
(Continued)

(56) References Cited

U.S. PATENT DOCUMENTS

2015/0096787 A1  4/2015  Perng et al.
2016/0007464 A1  1/2016  Matsubara et al.
(Continued)

FOREIGN PATENT DOCUMENTS

JP        11-177012 A      7/1999
JP     2007-266385 A     10/2007
(Continued)

OTHER PUBLICATIONS

International Preliminary Report on Patentability (PCT/IB/338 & PCT/IB/373) issued in PCT Application No. PCT/JP2021/035111 dated Jul. 13, 2023, Including English translation of (Japanese-language Written Opinion (PCT/ISA/237), filed on Apr. 3, 2023) (6 pages).

(Continued)

*Primary Examiner* — Stanley Tso
(74) *Attorney, Agent, or Firm* — Crowell & Moring LLP

(57) ABSTRACT

An object of the present invention is to provide an electronic control device capable of improving the connection life and reliability of solder connecting a printed circuit board and a QFN type semiconductor package. For this purpose, a printed circuit board 106 includes a first land 109 connected to a first metal terminal 104 via a solder 107, a second land 110 connected to a second metal terminal 105 via a solder 108, a third land 112 disposed on the outer peripheral side of a semiconductor package 101 with respect to the first land 109, and a resist 113 formed on the third land 112 so as to be in contact with the lower surface of a molding resin 103.

2 Claims, 3 Drawing Sheets

(51) Int. Cl.
    *H01L 23/31*     (2006.01)
    *H05K 3/34*     (2006.01)

(58) Field of Classification Search
    USPC .......................................................... 361/783
    See application file for complete search history.

(56) References Cited

U.S. PATENT DOCUMENTS

2019/0013263 A1*   1/2019   Kyozuka ........... H01L 23/49816
2019/0067232 A1*   2/2019   Wirz ....................... H01L 24/14

FOREIGN PATENT DOCUMENTS

| JP | 2012-4590 A | | 1/2012 |
|---|---|---|---|
| JP | 2013-12569 A | | 1/2013 |
| JP | 2013012567 | * | 1/2013 |
| JP | 2017-208422 A | | 11/2017 |
| JP | 6483498 B2 | | 3/2019 |

OTHER PUBLICATIONS

International Search Report (PCT/ISA/210) issued in PCT Application No. PCT/JP2021/035111 dated Nov. 30, 2021 with English translation (four (4) pages).

Japanese-language Written Opinion (PCT/ISA/237) issued in PCT Application No. PCT/JP2021/035111 dated Nov. 30, 2021 (four (4) pages).

* cited by examiner

ELECTRONIC CONTROL DEVICE

TECHNICAL FIELD

The present invention relates to an electronic control device, and particularly to a method for improving connection life and reliability of solder for connecting an electronic component and a printed circuit board.

BACKGROUND ART

In recent years, in order to cope with high functional cost reduction of electronic devices, it is required to mount semiconductor devices installed on electronic devices at high density on a substrate, and accordingly, adoption and expansion of high-functional and small consumer application packages for in-vehicle components have been advanced. One of semiconductor packages proposed to satisfy the above requirement is a quad flat no led package (QFN package). As a problem when the QFN package is used for in-vehicle applications, the electrode terminal is also downsized in accordance with the downsizing of the package itself, so that the heat cycle life of the solder connection portion tends to be short. As a countermeasure against this, a package in which a terminal that is not electrically used is provided at a corner portion of the package having a large load on the solder due to deformation during the heat cycle is increased.

CITATION LIST

Patent Literature

PTL 1: JP 6483498 B1

SUMMARY OF INVENTION

Technical Problem

On the other hand, the substrate side is still in the middle of coping with the package subjected to the heat cycle countermeasure. Therefore, an object of the present invention is to improve the connection life and reliability of the solder by taking a measure on the board side so that the solder thickness of the component mounting portion can be secured in order to use a quad flat no led package (QFN package), which is often used in high-performance small components, on a vehicle.

Solution to Problem

In order to achieve the above object, the present invention provides an electronic control device including: a printed circuit board; and a semiconductor package mounted on the printed circuit board. The semiconductor package includes: a semiconductor chip; a molding resin that encloses the semiconductor chip; a first metal terminal that is thermally connected to the semiconductor chip and exposed from a lower surface of the molding resin; and a second metal terminal that is not electrically connected to the semiconductor chip and exposed from four corners of the lower surface of the molding resin. In the electronic control device including: a first land connected to the first metal terminal via a solder; and a second land connected to a second metal terminal via a solder, the printed circuit board includes: a third land disposed on an outer peripheral side of the semiconductor package with respect to the first land; and a resist formed on the third land so as to be in contact with the lower surface of the molding resin.

According to the present invention configured as described above, by supporting the semiconductor package with respect to the printed circuit board with the resist formed on the third land, it is possible to prevent the semiconductor package from being inclined when the semiconductor package is soldered to the printed circuit board 106. As a result, since the thickness of the solder connecting the second metal terminal and the second land is secured to a certain value or more, the connection life and reliability of the solder are improved. Further, since the reliability of the solders disposed at the four corners of the semiconductor package is improved, it is possible to reduce the load on the solder connecting the land and other metal terminals disposed at positions other than the four corners of the semiconductor package.

Advantageous Effects of Invention

According to the electronic control device of the present invention, it is possible to improve the connection life and reliability of the solder that connects the printed circuit board and the QFN type semiconductor package.

DESCRIPTION OF EMBODIMENTS

Figure 1:
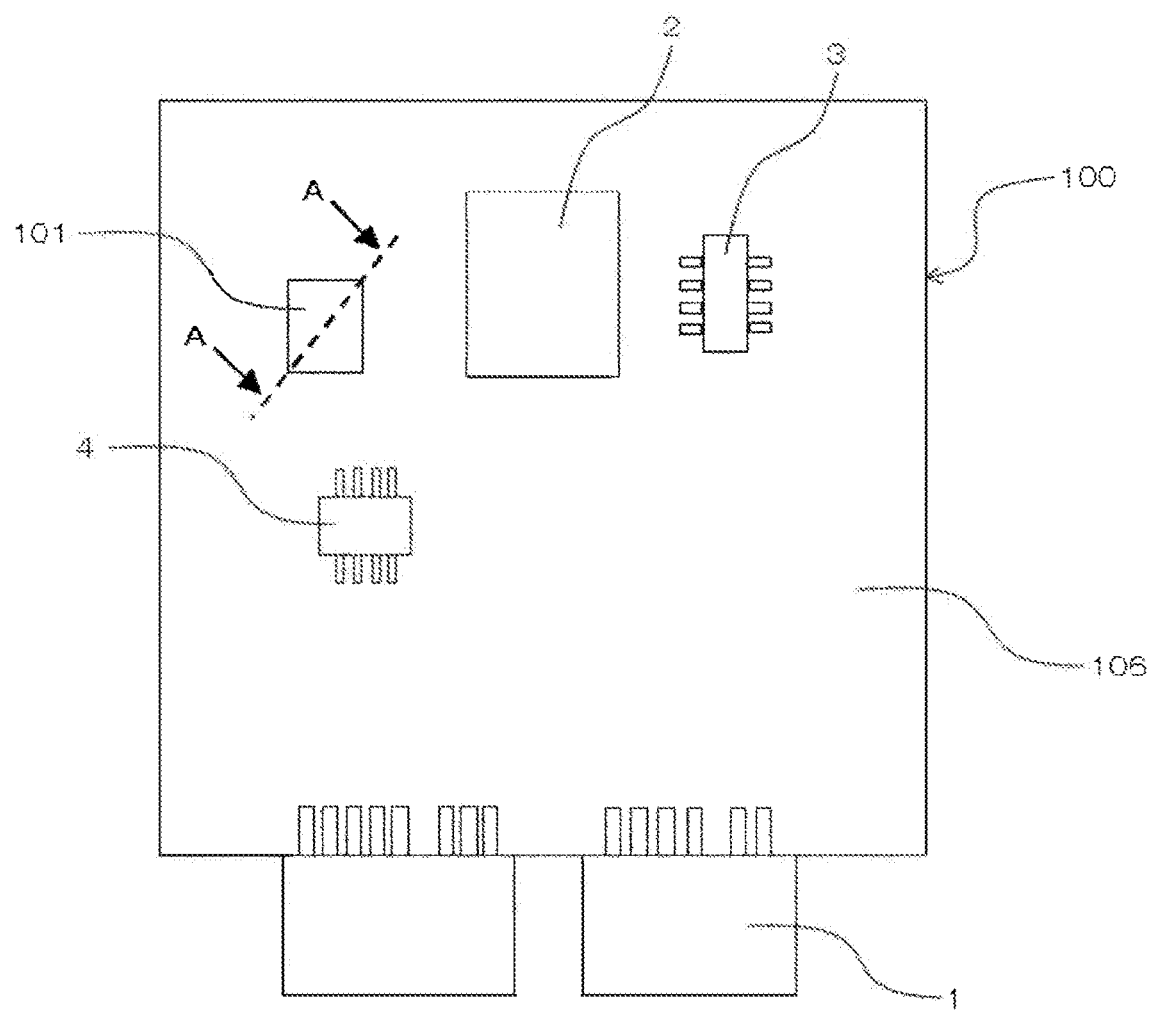
FIG. 1 is an overall view of an electronic control device according to a first embodiment of the present invention.

Hereinafter, an embodiment of the present invention will be described with reference to the drawings by taking an in-vehicle electronic control device as an example. Note that, in each drawing, the same elements are denoted by the same reference numerals, and redundant description will be omitted as appropriate.

First Embodiment

FIG. 1 is an overall view of an electronic control device according to a first embodiment of the present invention. In FIG. 1, an electronic control device 100 includes a connector 1 and a printed circuit board 106. Various electronic components 2, 3, and 4 and an electronic component 101 configured by a QFN type semiconductor package are mounted on the printed circuit board 106. The printed circuit board 106 is electrically connected to a wire harness (not shown) of the vehicle via the connector 1.

Figure 2:
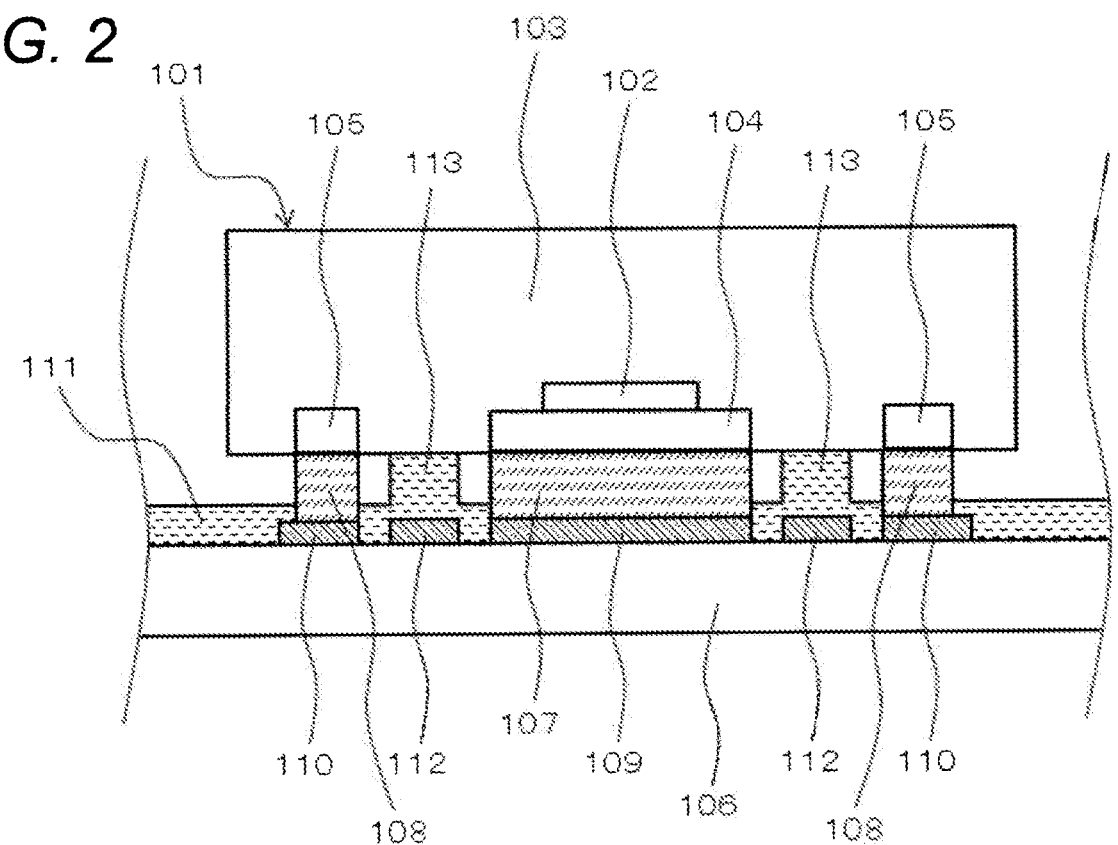
FIG. 2 is a cross-sectional view of the vicinity of a semiconductor package of the electronic control device according to the first embodiment of the present invention.

FIG. 2 is a cross-sectional view (a cross-sectional view taken along line A-A) of the electronic control device 100 in the vicinity of the semiconductor package 101, and illustrates a solder connection structure with the printed circuit board 106 of the semiconductor package 101.

The semiconductor package 101 includes a semiconductor chip 102, a molding resin 103 that houses semiconductor chip 102, a first metal terminal 104 for releasing heat generated in semiconductor chip 102 to printed circuit board 106, and second metal terminals 105 disposed at four corners of molding resin 103. The second metal terminal 105 is a dummy terminal and is electrically independent of the semiconductor chip 102.

The first metal terminal 104 is connected to a first land 109 of the printed circuit board 106 via a solder 107. The second metal terminal 105 is connected to a second land 110 of the printed circuit board 106 via a solder 108. The surface of the printed circuit board 106 is covered with a coating resin 111. A third land 112 electrically independent of the first land 109 and the second land 110 is disposed between the first land 109 and the second land 110. A resist 113 is formed on the third land 112 so as to protrude toward the molding resin 103. The resist 113 is formed of, for example, the same member as the coating resin 111, and is formed when the printed circuit board 106 is covered. The height of the resist 113 is determined according to the thickness of the solder 108 connecting the second metal terminal 105 and the second land 110. By providing such a resist 113, when the semiconductor chip 102 is soldered to the printed circuit board 106, the outer peripheral side of the semiconductor chip 102 of the molding resin 103 can be supported with respect to the printed circuit board 106, so that the thickness of the solder 108 can be secured. In FIG. 2, the third land 112 is located on the diagonal line of the semiconductor package 101, but may be located on a line other than the diagonal line of the semiconductor package 101 as long as it is on the outer peripheral side of the first land 109 of the semiconductor package 101 and on the inner peripheral side of the second land 110.

Conclusions

In the present embodiment, the printed circuit board 106 and the semiconductor package 101 mounted on the printed circuit board 106 are provided. The semiconductor package 101 includes the semiconductor chip 102, the molding resin 103 that encloses the semiconductor chip 102, the first metal terminal 104 that is thermally connected to the semiconductor chip 102 and exposed from the lower surface of the molding resin 103, and the second metal terminal 105 that is electrically independent of the semiconductor chip 102 and exposed from four corners of the lower surface of the molding resin 103. In the electronic control device 100 including the first land 109 connected to the first metal terminal 104 via the solder 107 and the second land 110 connected to the second metal terminal 105 via the solder 108, the printed circuit board 106 includes the third land 112 disposed on the outer peripheral side of the semiconductor package 101 with respect to the first land 109 and the resist 113 formed on the third land 112 so as to be in contact with the lower surface of the molding resin 103.

According to the present embodiment configured as described above, by supporting the semiconductor package 101 with respect to the printed circuit board 106 with the resist 113 formed on the third land 112, it is possible to prevent the semiconductor package 101 from being inclined when the semiconductor package 101 is soldered to the printed circuit board 106. As a result, since the thickness of the solder 108 connecting the second metal terminal 105 and the second land 110 is secured to a certain value or more, the connection life and reliability of the solder 108 are improved. Further, since the reliability of the solders 108 disposed at the four corners of the semiconductor package 101 is improved, it is possible to reduce the load on the solder connecting the land and other metal terminals disposed at positions other than the four corners of the semiconductor package 101.

Second Embodiment

An electronic control device according to a second embodiment of the present invention will be described focusing on differences from the first embodiment.

Figure 3:
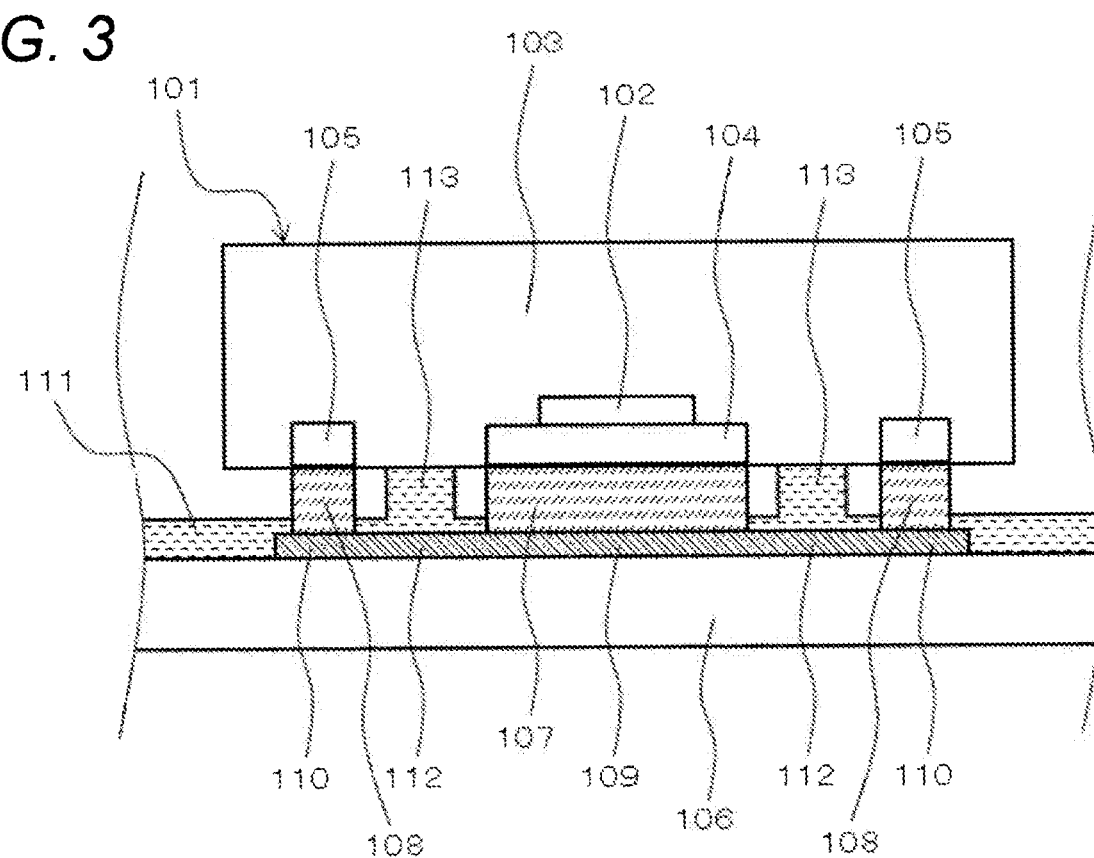
FIG. 3 is a cross-sectional view of the vicinity of a semiconductor package of an electronic control device according to a second embodiment of the present invention.

FIG. 3 is a cross-sectional view of the vicinity of the semiconductor package 101 of the printed circuit board 6 included in the electronic control device 100 according to the present embodiment. In FIG. 3, a difference from the first embodiment (shown in FIG. 2) is that the first land 109, the second land 110, and the third land 112 are electrically connected. In FIG. 3, the third land 112 is disposed on the diagonal line of the semiconductor package 101, but may be disposed on a position other than the diagonal line of the semiconductor package 101 as long as the position is on the outer peripheral side of the first land 109 and on the inner peripheral side of the second land 110 of the semiconductor package 101.

Also in the present embodiment configured as described above, the same effects as those of the first embodiment can be achieved. In addition, since the third land 112 is electrically connected to the first land 109 and the second land 110, the area of the third land 112 serving as a base of the resist 113 is enlarged, so that the resist 113 can be easily formed.

Third Embodiment

An electronic control device according to a third embodiment of the present invention will be described focusing on differences from the first embodiment.

Figure 4:
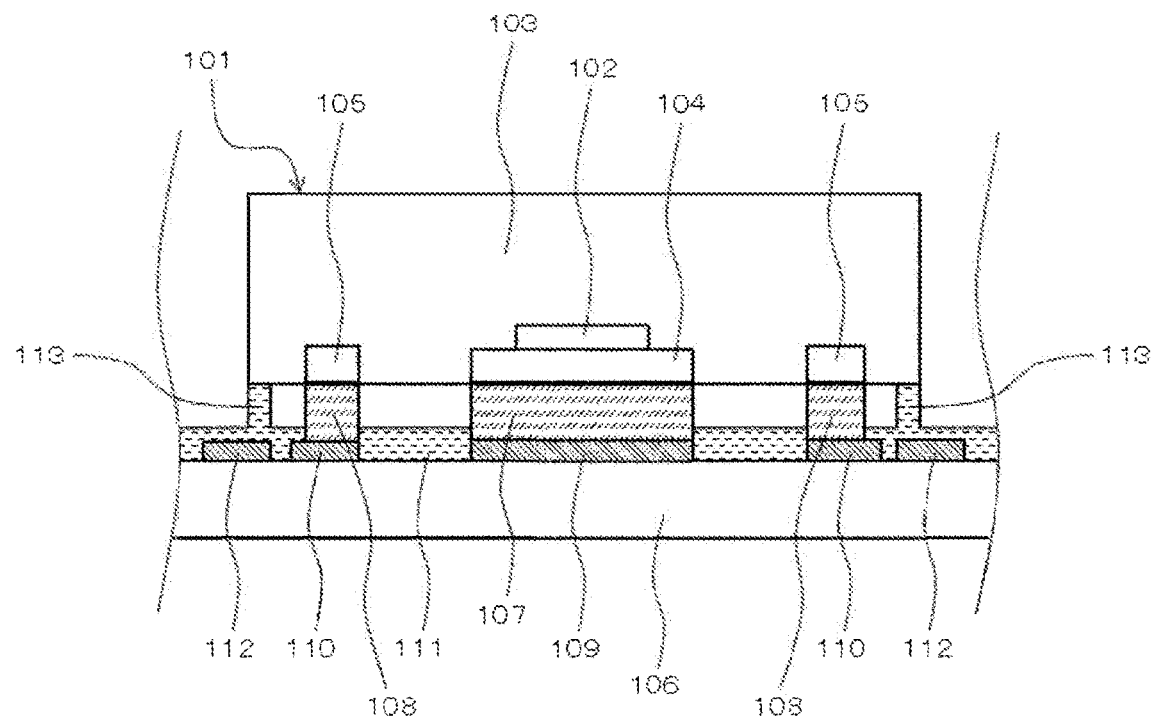
FIG. 4 is a cross-sectional view of the vicinity of a semiconductor package of an electronic control device according to a third embodiment of the present invention.

FIG. 4 is a cross-sectional view of the vicinity of the semiconductor package 101 of the printed circuit board 106 included in the electronic control device 100 according to the present embodiment. In FIG. 4, the third land 112 is disposed on the outer peripheral side of the semiconductor package 101 with respect to the second land 110. Accordingly, the resist 113 formed on the third land 112 is disposed on the outer peripheral side of the semiconductor package 101 with respect to the solder 108 connecting the second metal terminal 105 and the second land 110. In FIG. 4, the third land 112 is disposed on the diagonal line of the semiconductor package 101, but may be disposed on other than the diagonal line of the semiconductor package 101 as long as it is on the outer peripheral side of the second land 110 of the semiconductor package 101.

Also in the present embodiment configured as described above, since it is possible to prevent the semiconductor package 101 from being inclined when the semiconductor package 101 is soldered to the printed circuit board 106, it is possible to achieve the same effect as that of the first embodiment. In addition, by disposing the resist 113 on the outer peripheral side of the semiconductor package 101 with respect to the solder 108, it is possible to more effectively suppress the inclination of the semiconductor package 101.

Fourth Embodiment

An electronic control device 100 according to a fourth embodiment of the present invention will be described focusing on differences from the third embodiment.

Figure 5:
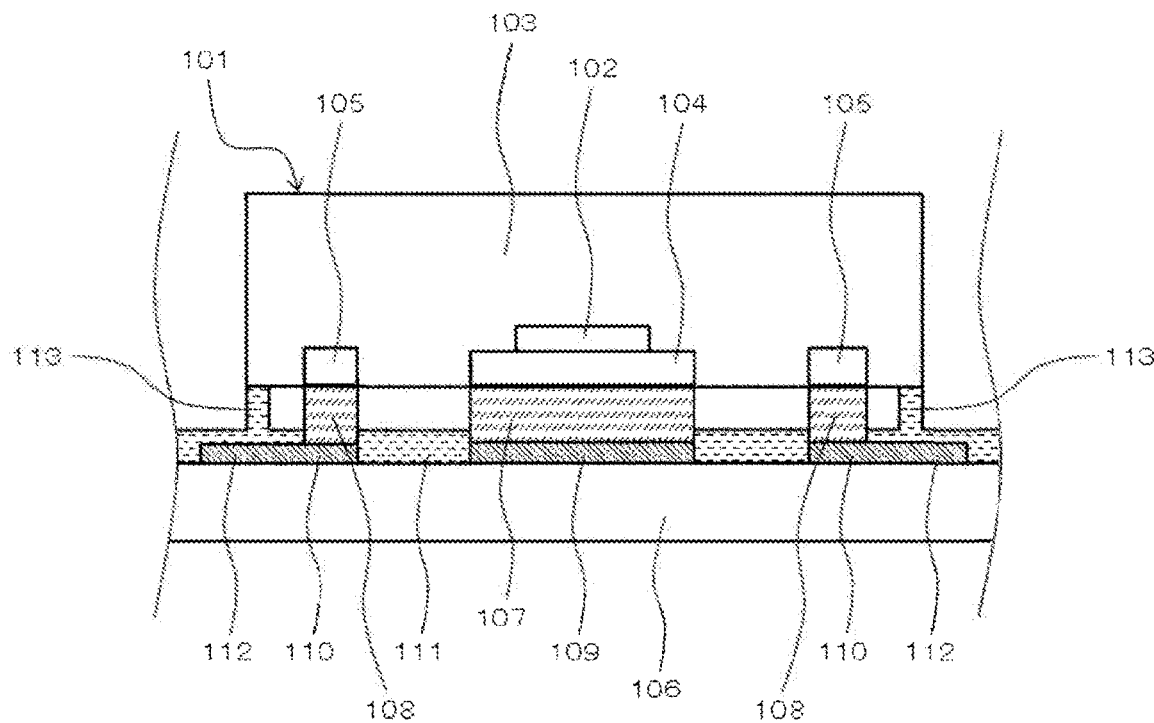
FIG. 5 is a cross-sectional view of the vicinity of a semiconductor package of an electronic control device according to a fourth embodiment of the present invention.

FIG. 5 is a cross-sectional view of the vicinity of the semiconductor package 101 of the printed circuit board 106 included in the electronic control device 100 according to the present embodiment. In FIG. 5, a difference from the third embodiment (shown in FIG. 4) is that the second land 110 and the third land 112 are electrically connected. In FIG. 5, the third land 112 is disposed on the diagonal line of the semiconductor package 101, but may be disposed on other than the diagonal line of the semiconductor package 101 as long as it is on the outer peripheral side of the second land 110 of the semiconductor package 101.

Also in the present embodiment configured as described above, the same effects as those of the third embodiment can be achieved. In addition, by electrically connecting the second land 110 and the third land 112, the area of the third land 112 serving as a base of the resist 113 is enlarged, so that the resist 113 can be easily formed.

Although the embodiments of the present invention have been described in detail above, the present invention is not limited to the above-described embodiments and includes various modifications. For example, the above embodiments have been described in detail for easy understanding of the present invention, and the present invention is not necessarily limited to those having all the configurations described. In addition, a part of the configuration of another embodiment can be added to the configuration of a certain embodiment, and a part of the configuration of a certain embodiment can be deleted or replaced with a part of another embodiment.

REFERENCE SIGNS LIST 100 electronic control device
101 semiconductor package
102 semiconductor chip
103 molding resin
104 first metal terminal
105 second metal terminal
106 printed circuit board
107, 108 solder
109 first land
110 second land
111 coating resin
112 third land
113 resist

The invention claimed is:

1. An electronic control device comprising:
a printed circuit board; and
a semiconductor package mounted on the printed circuit board, wherein
the semiconductor package includes:
a semiconductor chip;
a molding resin that encloses the semiconductor chip;
a first metal terminal that is thermally connected to the semiconductor chip and exposed from a lower surface of the molding resin; and
a second metal terminal that is electrically independent of the semiconductor chip and exposed from four corners of the lower surface of the molding resin,
the printed circuit board includes:
a first land connected to the first metal terminal via a first solder;
a second land connected to the second metal terminal via a second solder;
a third land disposed on an outer peripheral side of the semiconductor package with respect to the first land; and
a resist formed on the third land so as to be in contact with the lower surface of the molding resin, wherein
the resist formed on the third land is formed of resin, and
the resist is formed of coating resin that covers a surface of the printed circuit board,
the third land is disposed on an outer peripheral side of the semiconductor package with respect to the second land, and
the third land is located on a diagonal of the semiconductor package,
and the third land is electrically connected to the second land.

2. The electronic control device according to claim 1, wherein the third land is electrically connected to the first land and the second land.

* * * * *